US012595413B2

(12) United States Patent
Bilodeau et al.

(10) Patent No.: US 12,595,413 B2
(45) Date of Patent: Apr. 7, 2026

(54) SILICON NITRIDE ETCHING COMPOSITIONS AND METHOD

(71) Applicant: ENTEGRIS, INC., Billerica, MA (US)

(72) Inventors: Steven M. Bilodeau, Fairfield, CT (US); Claudia Yevenes, White Plains, NY (US)

(73) Assignee: ENTEGRIS, INC., Billerica, MA (US)

( * ) Notice: Subject to any disclaimer, the term of this patent is extended or adjusted under 35 U.S.C. 154(b) by 268 days.

(21) Appl. No.: 18/144,502

(22) Filed: May 8, 2023

(65) Prior Publication Data

US 2023/0365863 A1 Nov. 16, 2023

Related U.S. Application Data

(60) Provisional application No. 63/341,801, filed on May 13, 2022.

(51) Int. Cl.

| | |
|---|---|
| ***C09K 13/06*** | (2006.01) |
| ***C09K 13/00*** | (2006.01) |
| ***H01L 21/306*** | (2006.01) |
| ***H01L 21/311*** | (2006.01) |
| ***H01L 21/3213*** | (2006.01) |

(52) U.S. Cl.

CPC .............. *C09K 13/06* (2013.01); *C09K 13/00* (2013.01); *H01L 21/30604* (2013.01); *H01L 21/31105* (2013.01); *H01L 21/31111* (2013.01); *H01L 21/32134* (2013.01)

(58) Field of Classification Search

None

See application file for complete search history.

(56) References Cited

U.S. PATENT DOCUMENTS

| | | | |
|---|---|---|---|
| 10,465,112 B2 | 11/2019 | Lee et al. | |
| 11,053,440 B2 | 7/2021 | Bilodeau et al. | |
| 2012/0145672 A1 | 6/2012 | Ratkovich et al. | |
| 2018/0337253 A1* | 11/2018 | Bilodeau | H01L 21/31111 |
| 2021/0054236 A1 | 2/2021 | Park et al. | |
| 2021/0108140 A1 | 4/2021 | Kim et al. | |

FOREIGN PATENT DOCUMENTS

| | | |
|---|---|---|
| CN | 102534620 A | 7/2012 |
| CN | 101490201 B | 1/2013 |
| KR | 20120117682 A | 10/2012 |

(Continued)

OTHER PUBLICATIONS

M. Kniffin et al., The Effect of Aqueous Chemical Cleaning Procedures on Schottky Contacts to N-Type Gaas, MRS Online Proceedings Library, 1990, 181, 565-568 (https://doi.org/10.1557/PROC-181-565).

(Continued)

*Primary Examiner* — Jiong-Ping Lu

(57) ABSTRACT

Provided are compositions and methods for the wet etching of a surface of a microelectronic device substrate which contains surfaces comprising silicon nitride, silicon oxide, and polysilicon. The method of the invention involves a passivation step and a silicon nitride etching step, as more fully described below. The combination of the two steps was found to greatly improve the selectivity of the silicon nitride etching operation in the presence of polysilicon.

9 Claims, 2 Drawing Sheets

(56) References Cited

FOREIGN PATENT DOCUMENTS

| | | | |
|---|---|---|---|
| KR | 20140079267 | A | 6/2014 |
| KR | 20170130665 | A | 11/2017 |
| KR | 20200071644 | A | 6/2020 |
| TW | 201920615 | A | 6/2019 |
| WO | 2021067150 | A1 | 4/2021 |
| WO | 2022026739 | A1 | 2/2022 |

OTHER PUBLICATIONS

Kwan Hong Min et al., Wet Chemical Oxidation to Improve Interfacial Properties of Al2O3/Si and Interface Analysis of Al2O3/SiOx/Si Structure Using Surface Carrier Lifetime Simulation and Capacitance—Voltage Measurement, Energies, Energies. 2020; 13(7):1803. https://doi.org/10.3390/en13071803.

* cited by examiner

SILICON NITRIDE ETCHING COMPOSITIONS AND METHOD

PRIORITY CLAIM

This application claims priority to U.S. provisional patent No. 63/341,801 with a filing date of May 13, 2022. The priority document is incorporated herein for all purposes.

TECHNICAL FIELD

The invention relates to compositions and methods for selectively etching silicon nitride in the presence of silicon oxide and polysilicon.

BACKGROUND

In the microelectronics industry, ongoing demand exists for improved device performance and for decreased device sizes and decreased device feature sizes. Reduced feature sizes provide dual advantages of increasing device feature density and increasing device speed.

Reducing feature and device sizes requires finding new ways to improve steps of the multi-step process of manufacturing microelectronic devices. In methods for preparing many types of microelectronic devices, a step of removing silicon nitride is common. A thin layer of silicon nitride ($Si_3N_4$), typically deposited by chemical vapor deposition from silane ($SiH_4$) and ammonia ($NH_3$), can be useful in a microelectronic device as a barrier for water and sodium. Also, patterned silicon nitride layers are used as a mask for spatially selective silicon oxide growth. After being applied, all or a portion of these silicon nitride materials may require removal, which is commonly performed by etching.

The removal of silicon nitride from a substrate by etching is advantageously performed in a manner that does not damage or disrupt other exposed or covered features of a microelectronic device. Often, a process of removing silicon nitride is performed in a manner that preferentially removes the silicon nitride relative to other materials that are also present at a surface of a microelectronic device substrate, such as silicon oxide. According to various commercial methods, silicon nitride is removed from a microelectronic device surface by a wet etching process that involves exposing the substrate surface to concentrated phosphoric acid ($H_3PO_4$) at an elevated temperature, e.g., in a bath having a temperature in a range from 150° C. to 180° C. Conventional wet etching techniques for selectively removing silicon nitride relative to silicon oxide have used aqueous phosphoric acid ($H_3PO_4$) solutions, typically about 85 weight percent phosphoric acid and 15 weight percent water. Using fresh hot phosphoric acid, a typical $Si_3N_4$:$SiO_2$ selectivity can be about 40:1.

In further device structures, in addition to silicon oxide, exposed surfaces of polysilicon may also be present, which further complicates a desired selective silicon nitride etching process. Thus, there is a need for compositions and methods useful for preferentially etching silicon nitride in the presence of silicon oxide and polysilicon surfaces.

SUMMARY

In summary, the invention relates to compositions and methods for the wet etching of a surface of a microelectronic device substrate which contains surfaces comprising silicon nitride, silicon oxide, and polysilicon. Optionally, other materials are present on the substrate, such as a conductive material, a semiconducting material, or an insulating material useful in a microelectronic device, or a processing material that is useful in preparing a microelectronic device. Materials such as metal silicides may also be present but are often not exposed except in the case of defects such as cracks or lithography misalignment. The method of the invention involves a passivation step and a silicon nitride etching step, as more fully described below. The combination of the two steps was found to greatly improve the selectivity of the silicon nitride etching operation in the presence of polysilicon and silicon oxide.

DETAILED DESCRIPTION

Figure 1:
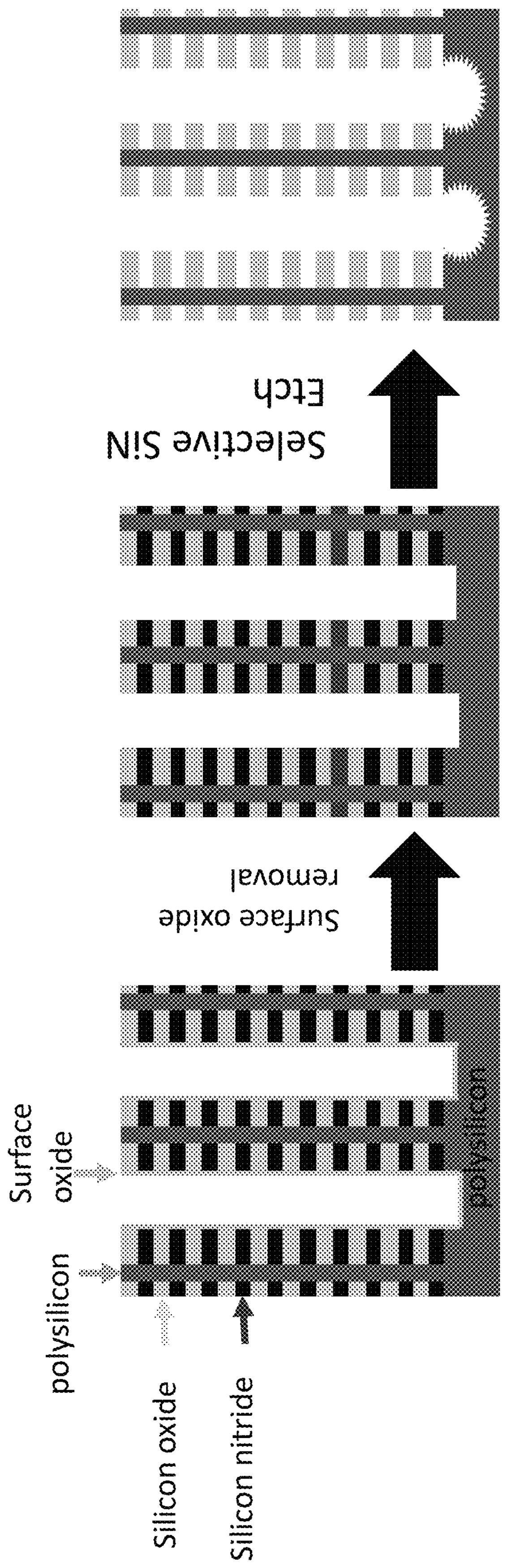
FIG. 1 presents an illustration of a process flow showing a structure with polysilicon at the bottom of a via, while also containing silicon oxide and silicon nitride surfaces. The first step of surface oxide removal is typically conducted with dilute hydrogen fluoride. Without the passivation step of the invention, exposed polysilicon is typically and undesirably etched and roughened during the silicon nitride etch step.
Figure 2:
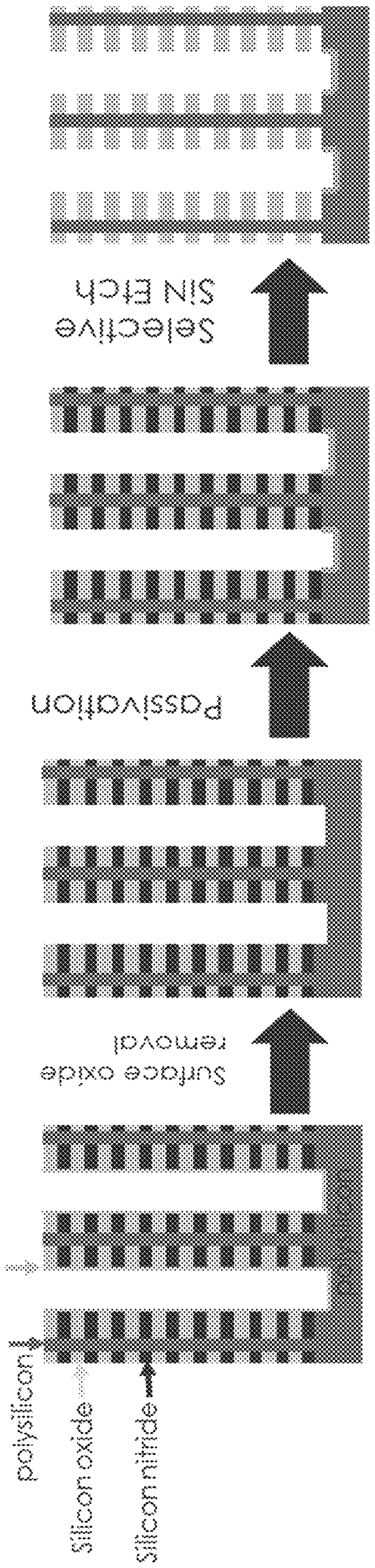
FIG. 2 presents an illustration of the results of the method of the invention, where a microelectronic device substrate having polysilicon, silicon oxide, and silicon nitride surfaces is subjected to the process of the invention, with greatly diminished etching and roughening of the exposed polysilicon surface.

As used in this specification and the appended claims, the singular forms “a”, “an”, and “the” include plural referents unless the content clearly dictates otherwise. As used in this specification and the appended claims, the term “or” is generally employed in its sense including “and/or” unless the content clearly dictates otherwise.

The term “about” generally refers to a range of numbers that is considered equivalent to the recited value (e.g., having the same function or result). In many instances, the term “about” may include numbers that are rounded to the nearest significant figure.

Numerical ranges expressed using endpoints include all numbers subsumed within that range (e.g., 1 to 5 includes 1, 1.5, 2, 2.75, 3, 3.80, 4 and 5). In a first aspect, the invention provides a composition comprising the reaction product of:

a. about 20 to about 80 weight percent of sulfuric acid;
b. about 20 to about 80 weight percent of water;
c. about 0.01 to about 0.4 weight percent of sulfurous acid;
d. about 0.1 to about 10 weight percent of nitric acid; and optionally
e. about 0.001 to about 0.1 weight percent of formic acid.

In these compositions, the starting material components thus comprise a. through d., and optionally e., with the total weight percent of such components being 100 weight percent. In one embodiment, the composition is the reaction product of;

a. about 59 to about 65 weight percent of sulfuric acid;
b. about 36 to about 41 weight percent of water;
c. about 0.01 to about 0.3 weight percent of sulfurous acid;
d. about 0.1 to about 0.04 weight percent of nitric acid; and optionally
e. about 0.005 to about 0.1 weight percent of formic acid.

In a further embodiment of this aspect, the nitric acid is utilized in an amount of about 0.1 to about 0.25 weight percent, based on the total weight of the composition.

As noted above, this first aspect is a composition which is the reaction product of the recited starting materials. In solution, the primary oxidizing agent is nitric acid. The sulfurous acid is believed to reduce some of the nitric acid to provide more active oxidizing species in situ, such as nitrogen dioxide and nitrous acid.

In certain embodiments, the composition also utilizes formic acid, which helps to extend bath life. In the composition of this aspect, the formic acid is likely partially oxidized to performic acid.

The compositions of this first aspect are useful as passivating compositions in the selective etching of silicon nitride on microelectronic substrates. The compositions were found to be effective in passivating surfaces which are other than silicon nitride, in particular polysilicon and silicon oxide surfaces, which are typically also present on the microelectronic device substrate when a desired silicon nitride etching step is conducted.

In the selective etching of silicon nitride, the first step generally involves the removal of any residual surface oxide material on the silicon nitride surface, typically with dilute HF, and then the microelectronic device substrate is treated with the composition of this first aspect, followed by rinsing and then treatment with a silicon nitride etching composition. Accordingly, in a second aspect, the invention provides a method of selectively etching silicon nitride on a microelectronic device substrate, the substrate comprising a surface comprising silicon nitride, a surface comprising silicon oxide, and a surface comprising polysilicon, the method comprising:

a. exposing a microelectronic device substrate comprising surfaces of silicon nitride, silicon oxide, and polysilicon, to a composition comprising nitrous acid;

followed by b. rinsing the substrate with a liquid solution comprising water; and c. exposing the substrate to a composition effective in etching silicon nitride under conditions effective to etch silicon nitride.

In one embodiment, the invention provides a method of selectively etching silicon nitride on a microelectronic device substrate, the substrate comprising a surface comprising silicon nitride, a surface comprising silicon oxide, and a surface comprising polysilicon, the method comprising:

a. exposing a microelectronic device substrate comprising surfaces of silicon nitride, silicon oxide, and polysilicon, to a composition comprising the reaction product of:

i. about 20 to about 80 weight percent of sulfuric acid;

ii. about 20 to about 80 weight percent of water;

iii. about 0.01 to about 0.4 weight percent of sulfurous acid;

iv. about 0.1 to about 10 weight percent of nitric acid; and optionally v. about 0.001 to about 0.1 weight percent of formic acid.

followed by b. rinsing the substrate with a liquid solution comprising water; and c. exposing the substrate to a composition effective in etching silicon nitride under conditions effective to etch silicon nitride.

In this method, compositions effective in etching silicon nitride (i.e., step c.) include those compositions known in the art to be effective in etching silicon nitride, such as phosphoric acid and water mixtures. In this method, the initial passivation step (a), conducted prior to silicon nitride etching, was found to greatly enhance the selectivity of the silicon nitride etching, relative to polysilicon surfaces present on the microelectronic device substrate.

In one embodiment, the composition effective in etching silicon nitride is comprised of at least 60, at least 70, at least 80, or at least 90 weight percent, based on the total weight of the composition of phosphoric acid.

In another embodiment, the composition effective in etching silicon nitride is further comprised of various additives, outlined below.

In one embodiment, the composition effective in etching silicon nitride further comprises:

a composition comprising:

a. a compound of the formula

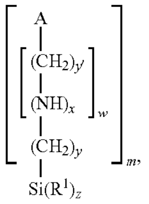

wherein A is an aromatic ring or a heteroaromatic ring, and wherein each $R^1$ is the same or different and is chosen from hydrogen, hydroxy or hydroxyl, $C_1$-$C_{20}$ alkyl, $C_1$-$C_{20}$ alkylamino, phenyl, benzyl, and $C_1$-$C_{20}$ alkoxy, phenoxy, and $C_3$-$C_8$ cycloalkyl; x is 0 or 1; each y and y' may be the same or different and is zero or is chosen from an integer of from 1 to 5; z is an integer chosen from 1, 2, or 3; m is an integer chosen from 1, 2, or 3; w is zero or an integer chosen from 1, 2, 3, or 4 and m+z=4; and/or b. a compound of the formula:

$(R^1)_3Si\text{-}M\text{-}Si(R^1)_3$, wherein each $R^1$ is the same or different and is as defined above, and -M- is chosen from —NH— or —O—.

In one embodiment, the compositions effective in etching silicon nitride may further comprise compounds described in US Patent Publication 2021/0054236, incorporated herein by reference. Exemplary compounds include those of the formula

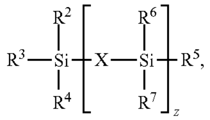

wherein X is O or N; $R^2$ to $R^7$ are each independently chosen from hydrogen, $C_1$-$C_{20}$ alkyl, $C_1$-$C_{20}$ alkoxy, $C_2$-$C_{20}$ alkenyl, $C_3$-$C_{20}$ cycloalkyl, $C_1$-$C_{20}$ aminoalkyl, $C_6$-$C_{20}$ aryl, $C_1$-$C_{20}$ alkylcarbonyl, $C_1$-$C_{20}$ alkylcarbonyloxy, $C_1$-$C_{10}$ cyanoalkyl; z is 0 or 1; and at least two of $R^2$ to $R^5$ are $C_1$-$C_{20}$ alkoxy groups when z is 0.

In certain embodiments, the compositions of the invention can further comprise at least one silane chosen from (a) alkylamino alkoxysilanes and (b) alkylamino hydroxyl silanes, wherein the silane possesses at least one moiety chosen from alkoxy and hydroxyl. In one embodiment, the alkylamino alkoxysilane and alkylamino hydroxyl silane compounds are chosen from N-(3-trimethoxysilylpropyl)diethylenetriamine;
N-(2-aminoethyl)-3-aminopropyltriethoxy silane;
N-(2-aminoethyl)-3-aminopropyl silane triol;
$N^1$-(3-trimethoxysilylpropyl)diethylenetriamine;
N-(6-aminohexyl)aminopropyltrimethoxysilane;
(3-aminopropyl)triethoxy-silane; and
(3-aminopropyl)silane triol (APST), and phosphate esters thereof.

The compounds above tend to form phosphate esters in concentrated phosphoric acid solutions in an equilibrium reaction, so in practice, at least a portion of such compounds would exist as phosphate esters.

As used herein, the term "microelectronic device" (or "microelectronic device substrate," or simply "substrate") is used in a manner that is consistent with the generally understood meaning of this term in the electronics, microelectronics, and semiconductor fabrication arts, for example to refer to any of a variety of different types of: semiconductor substrates; integrated circuits; solid state memory devices; hard memory disks; read, write, and read-write heads and mechanical or electronic components thereof; flat panel displays; phase change memory devices; solar panels and other products that include one or more solar cell devices; photovoltaics; and microelectromechanical systems (MEMS) manufactured for use in microelectronic, integrated circuit, energy collection, or computer chip applications. It is to be understood that the term "microelectronic device" can refer to any in-process microelectronic device or microelectronic device substrate that contains or is being prepared to contain functional electronic (electrical-current-carrying) structures, functional semiconductor structures, and insulating structures, for eventual electronic use in a microelectronic device or microelectronic assembly.

As used herein, the term "silicon nitride" is given a meaning that is consistent with the meaning of the term as used in the microelectronics and semiconductor fabrication industries. Consistent therewith, silicon nitride refers to materials including thin films made of amorphous silicon nitride with commercially useful low levels of other materials or impurities and potentially some variation around the nominal stoichiometry of $Si_3N_4$. The silicon nitride may be present as part of a microelectronic device substrate as a functioning feature of the device, for example as a barrier layer or an insulating layer, or may be present to function as a material that facilitates a multi-step fabrication method for preparing a microelectronic device.

As used herein, the term "silicon oxide" is given a meaning that is consistent with the meaning of the term as used in the microelectronics and semiconductor fabrication industries. Consistent therewith, silicon oxide refers to thin films made of silicon oxide ($SiO_x$), e.g., $SiO_2$, "thermal oxide" ($ThO_x$), and the like. The silicon oxide can be placed on the substrate by any method, such as by being deposited by chemical vapor deposition from TEOS or another source, or by being thermally deposited. The silicon oxide can advantageously contain a commercially useful low level of other materials or impurities. The silicon oxide may be present as part of a microelectronic device substrate as a feature of the microelectronic device, for example as an insulating layer.

As used herein, "polysilicon" or polycrystalline Si or poly-Si is understood by the person skilled in the art to be a polycrystalline form of silicon consisting of multiple small silicon crystals. It is typically deposited using low-pressure chemical vapor deposition (LPCVD) and is often doped n-type polysilicon or p-type polysilicon. The extent of doping can vary from lightly doped (e.g., in a range from $10^{13}$ $cm^{-3}$ to $10^{18}$ $cm^{-3}$) to heavily doped (e.g., greater than $10^{18}$ $cm^{3}$), as readily understood by the person skilled in the art. Examples of p-doped material include polysilicon doped with a dopant species from Group IIIA of the Periodic Table, such as boron, aluminum, gallium and/or indium. An n-doped material may for example be polysilicon doped with a dopant species from Group IV (silicon, germanium, or tin) or Group V (phosphorus, arsenic, antimony, or bismuth) of the Periodic Table.

Embodiments of certain etching compositions include compositions in the form of aqueous solutions that comprise, consist essentially of, or consist of: aqueous phosphoric acid (e.g., concentrated phosphoric acid and an optional an amount of added water), in conjunction with one or more of the compounds set forth above, in an amount effective to improve etch rate of silicon nitride or selectivity of silicon nitride relative to polysilicon; and optionally a fluoride compound in amounts that are effective to produce desired etching (including a useful or advantageous etch rate) of silicon nitride and/or optionally dissolved silica.

These and other example compositions can comprise, consist of, or consist essentially of the recited ingredients and optional ingredients. As a general convention throughout the present description a composition of matter such as an etching composition as described, or an ingredient or component thereof, that is said to "consist essentially of" a group of specified ingredients or materials refers to a composition that contains the specified ingredients or materials with not more than a low or insignificant amount of other ingredients or materials, e.g., not more than 5, 2, 1, 0.5, 0.1, or 0.05 parts by weight of other ingredients or materials.

The etching composition includes aqueous phosphoric acid (e.g., concentrated phosphoric acid) in an amount that is effective to produce desired etching of silicon nitride. The term "aqueous phosphoric acid" refers to an ingredient of the etching composition that is mixed or combined with other ingredients of the etching composition to form the etching composition. The term "phosphoric acid solids" refers to the non-aqueous component of an aqueous phosphoric acid ingredient, or of an etching composition that is prepared from aqueous phosphoric acid ingredient.

The amount of phosphoric acid solids contained in an etching composition can be an amount that, in combination with the other materials of an etching composition, will provide desired etching performance, including desired silicon nitride etch rate and selectivity, which typically requires a relatively high amount (concentration) of phosphoric acid solids. As noted above, the phosphoric acid will be present in proportions of at least 60, at least 70, at least 80, or at least 90 weight percent, based on the total weight of the composition of phosphoric acid. In certain embodiments, the phosphoric acid content will be between about 80 and 90 weight percent.

To provide a desired amount of phosphoric acid solids, the composition may contain "concentrated" phosphoric acid as an ingredient that is mixed or combined with other ingredients (one ingredient optionally being water, in some form) to produce the etching composition. "Concentrated" phosphoric acid refers to an aqueous phosphoric acid ingredient that contains a high or maximum amount of phosphoric acid solids in the presence of a low or minimum amount of water and substantially no other ingredients (e.g., less than 0.5 or 0.1 weight percent of any non-water or non-phosphoric acid solids materials). Concentrated phosphoric acid can typically be considered to have at least about 80 or 85 weight percent phosphoric acid solids in about 15 or 20 weight percent water. Alternately, the etching composition may be considered to include an amount of concentrated phosphoric acid that is diluted with water, meaning for example concentrated phosphoric acid that has been diluted with an amount of water before or after being combined with other ingredients of the etching composition, or an equivalent formed in any manner. As another alternative, an ingredient of the etching composition can be concentrated phosphoric acid or a diluted phosphoric acid, and the etching composition can contain an additional amount of water that is provided to the etching composition either as a component of a different ingredient or as a separate water ingredient.

As used herein, the term "fluoride compound" refers to certain etchants which are optionally added to increase the etch rate of the silicon nitride. Such compounds include, but are not limited to, HF, ammonium fluoride, tetrafluoroboric acid, hexafluorosilicic acid, other compounds containing B—F or Si—F bonds, tetrabutylammonium tetrafluoroborate (TBA-$BF_4$), tetraalkylammonium fluorides, and combinations thereof. In one embodiment, the fluoride compound is chosen from HF, ammonium fluoride, tetrafluoroboric acid, hexafluorosilicic acid, tetrabutylammonium tetrafluoroborate, tetra($C_1$-$C_6$ alkyl)ammonium fluorides, and combinations thereof.

The amount of the optional fluoride compound contained in the compositions of the invention can be an amount that, in combination with the other materials of an etching composition, will provide desired etching performance, including desired silicon nitride etch rate and selectivity. For example, an etching composition can contain an amount of a fluoride source compound in a range from about 5 to 10,000 or even up to 50,000 parts per million (i.e., from 0.0005 to 1 or even 5 weight percent) based on total weight of the etching composition, such as from about 20 to 2,000 parts per million (i.e., from 0.002 to 0.2 weight percent) based on total weight of the etching composition. In certain embodiments, the compositions are devoid or substantially devoid of such fluoride compounds. "Substantially devoid" as used herein is defined in certain embodiments as less than 2 weight percent, less than 1 weight percent, less than 0.5 weight percent, or less than 0.1 weight percent. "Devoid" as used herein is intended in certain embodiments to correspond to less than 0.001 weight percent to account for environmental contamination, and in another embodiment, 0.0 weight percent.

Optionally, the compositions of the invention can further comprise an amount of silica dissolved in the phosphoric acid ("added silica"), e.g., by dissolving solid silica material in the phosphoric acid or by adding a soluble silicon-containing compound that can form dissolved silica by reaction with aqueous phosphoric acid, examples of such compounds including (a) TMAS (tetramethylammonium silicate), (b) tetraacetoxysilane, or (c) a tetraalkoxysilane such as tetramethoxysilane, tetraethoxysilane, or the like. The dissolved silica may be effective to improve selectivity of an etching composition toward silicon nitride. The amount may be any useful amount that does not lead to pre-processing silica supersaturation at conditions of an etching process, such as from about 5 to 10,000 parts per million dissolved silica or soluble silicon-containing compound based on total weight of the etching composition, or from about 20 to 5,000, 3,000, 1,000, or 500 parts per million based on total weight of the etching composition. As with other additives discussed above, such compounds tend to form phosphate esters in concentrated phosphoric acid solutions in an equilibrium reaction, so in practice, at least a portion would exist as phosphate esters.

The etching composition can contain water from one or from multiple sources. For example, water will be present in an aqueous phosphoric acid ingredient. Additionally, water may be used as a carrier for one or more of the other ingredients of the composition, and water may be added alone as its own ingredient. The amount of water should be sufficiently low to allow the composition to exhibit desired or preferred or advantageous performance properties, including a useful (sufficiently high) silicon nitride etch rate. An increase in the presence of water tends to increase the etch rate of silicon nitride but can also depress the boiling point of the composition, which forces a reduction in operating temperature of the composition and an opposite effect. Examples of amounts of water, from all sources, in an etching composition, can be less than about 50, 40, or 30 weight percent, for example in a range from about 5 weight percent to about 25 percent by weight, based on total weight of the etching composition, or in a range from about 10 to 20 weight percent water based on total weight of the etching composition.

In certain embodiments, the compositions of the invention do not require and may exclude other types of ingredients not typically included in an etching composition, such as a pH adjusting agent and solid materials such as abrasive.

The compositions of the invention can be prepared by any method that will be useful to produce an etching composition as described. By one method, aqueous or solid ingredients can be combined, optionally with heat, and mixed to uniformity.

As noted above, the compositions as described can be useful for methods of removing silicon nitride from a surface of a microelectronic device substrate. The substrate can contain other materials that are useful in a microelectronic device, such as one or more of an insulator, barrier layer, conducting material, semiconducting material, or a material that is useful for processing a microelectronic device (e.g., photoresist, mask, among others). Example substrates have a surface that includes silicon nitride, thermal oxide (ThOx) and PETEOS (oxide deposited using plasma enhanced tetraethyl ortho silicate) as well as polysilicon.

In use, the compositions of the invention can provide etching performance that is useful based on commercial performance needs and expectations, and as compared to comparative etching compositions, can provide improved performance with respect to etch rate and selectivity of silicon nitride relative to polysilicon.

This silicon nitride etching operation is effective in at least partially removing silicon nitride on a surface of a microelectronic device substrate. The phrase "at least partially remove" corresponds to a removal of at least about 85% of the silicon nitride present on the device prior to particle removal, at least 90%, at least 95%, or at least about 99%.

This method can be performed on known and commercially available equipment. Generally, to etch a substrate to selectively remove a material at a surface of the substrate, etching composition can be applied to the surface and allowed to contact surface structures to selectively remove certain of the structures, chemically.

Silicon nitride films occasionally have a thin oxidized surface that can inhibit the etching process, since the composition is designed to etch oxide very slowly. In such cases, a very brief treatment with dilute HF can be an advantageous first process step.

In an etching step, the composition can be applied to the surface in any suitable manner, such as by spraying the composition onto the surface; by dipping (in a static or dynamic volume of the composition) the substrate into etching composition; by contacting the surface with another material, e.g., a pad, or fibrous sorbent applicator element, that has etching composition absorbed thereon; by contacting the substrate with an amount of the etching composition in a circulating pool; or by any other suitable means, manner or technique, by which the etching composition is brought into removal contact with the surface of the microelectronic substrate that contains silicon-germanium and silicon. The application may be in a batch or single wafer apparatus, for dynamic or static cleaning.

The conditions (e.g., time and temperature) of a useful etching process can be any that are found to be effective or advantageous. Generally, etching composition is contacted with the surface, such as by submersion in a bath of the etching composition, for a time that is sufficient to selectively remove silicon nitride. The time of exposure to the etching composition and the temperature of the etching composition can be effective for a desired amount of removal of the silicon nitride from a surface of the substrate. The amount of time for an etching step should not be too short, because this means that an etch rate of silicon nitride may be too high, which can lead to process control difficulties and reduced quality of a microelectronic device at the end of an etch step. Of course, the amount of time required for an etch step is preferably not unduly long, to allow good efficiency and throughput of an etching process and semiconductor fabrication line. Examples of useful times for an etching step may be in a range from about 5 minutes to about 300 minutes, or about 10 minutes to about 60 minutes, at a temperature in a range of from about 100° C. to about 180° C. Such contacting times and temperatures are illustrative, and any other suitable time and temperature conditions may be employed that are efficacious to achieve the required removal selectivity.

An etching step of the present description can be useful to etch silicon nitride material from a surface of any type of substrate. According to particular embodiments, a substrate can include alternating thin film layers of silicon nitride as structural features of a substrate that includes alternating thin film layers of the silicon nitride layers with silicon oxide as well as polysilicon, conductive metal silicides and dielectrics such as zirconium oxide or aluminum oxide. The substrate before the etch step includes the alternating layers of silicon nitride positioned in openings between high aspect ratio silicon oxide structures. Example etching processes can exhibit a good silicon nitride etch rate, good selectivity relative to silicon oxide of greater than about 150 and in certain embodiments, at least about 2000 or at least about 4000.

After completion of a desired amount of selective etching of silicon nitride, etching composition that remains on a surface of an etched microelectronic device can be removed from the surface by any desired and useful method, such as by a rinse, wash, or other removal step, using water (or optionally phosphoric acid followed by water). For example, after etching, a microelectronic device substrate may be rinsed with a rinse of deionized water (e.g., at a temperature in a range from about 20° C. to about 90° C.) followed by drying, e.g., spin-dry, $N_2$, vapor-dry etc. Following the rinse, the substrate surface may be measured for the presence and amount of particles at the surface.

The compositions described herein can be easily formulated by simple addition of the respective ingredients and mixing to homogeneous condition. Furthermore, the compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the semi-aqueous composition, i.e., more dilute or more concentrated, and it will be appreciated that the semi-aqueous compositions can variously and alternatively comprise, consist or consist essentially of any combination of ingredients consistent with the disclosure herein. Accordingly, in third aspect, the invention provides a kit, including in two or more containers, two or more of i. the passivating composition of the first aspect,
ii. phosphoric acid,
iii. water; and
iv. one or more compounds chosen from
tetramethylammonium silicate (TMAS)
N-(3-trimethoxysilylpropyl)diethylenetriamine;
N-(2-aminoethyl)-3-aminopropyltriethoxy silane;
N-(2-aminoethyl)-3-aminopropyl silane triol;
$N^1$-(3-trimethoxysilylpropyl)diethylenetriamine;
N-(6-aminohexyl)aminopropyltrimethoxysilane;
(3-aminopropyl)triethoxy-silane; and
(3-aminopropyl)silane triol (APST), and phosphate esters thereof.

The containers of the kit must be suitable for storing and shipping said semi-aqueous composition components, for example, NOWPak® containers (Entegris, Inc.) The one or more containers which contain the components of the composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended composition to a process tool.

Substantially chemically inert, impurity-free, flexible and resilient polymeric film materials, such as high-density polyethylene, can be used to fabricate the liners for said one or more containers. Desirable liner materials are generally processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" and U.S. Pat. No. 6,698,619 entitled "RETURNABLE AND REUSABLE, BAG-IN-DRUM FLUID STORAGE AND DISPENSING CONTAINER SYSTEM".

In the examples below blanket thin film samples of polysilicon have had their native oxide removed by exposure to 0.5 weight % HF in water at room temperature for 60 seconds. After HF exposure films were rinsed in deionized water and exposed to a passivation treatment. After passivation treatment samples were then rinsed in deionized water and dried with nitrogen. The polysilicon thickness was then measured using spectroscopic ellipsometry. Samples were then exposed to a selective nitride etching formulation for 2 hours at 160 C, rinsed, dried and the polysilicon thickness remeasured again. The etch rates in the table were calculated from the polysilicon thickness change and the selective nitride formulation exposure time.

EXAMPLES

| Example No. | Passivation Treatment | Silicon nitride etching formulation | Etch rate of unannealed $n^+$ polysilicon (Å/minute) | Etch rate of annealed $n^+$ polysilicon (Å/minute) |
|---|---|---|---|---|
| 1 | None | Composition B | 3.6 | 2.6 |
| 2 | None | Composition B Plus 0.0024 weight percent Calfax ® DBA-40 | 2.6 | 1 |
| 3 | $HCl:H_2O_2:H_20$ (1:1:5, by weight; 60° C. for 30 minutes) | Composition B | 0.07 | 1.6 |
| 4 | $HCl:H_2O_2:H_2O$ (1:1:5 plus 1.4% HEDP, by weight; 20° C. for 30 minutes) | Composition B | 0.07 | 1.7 |
| 5 | $H_2SO_4:H_2O_2:H_2O$ (1:1:5, by weight, 60° C. for 30 minutes) | Composition B | 4.9 | 1.6 |
| 6 | Composition A (40° C. for 30 minutes) | Composition B | 0.07 | 0.6 |
| 7 | Composition A (60° C. for 30 minutes) | Composition B | 0.06 | 0.3 |

Composition B, the silicon nitride etching composition is phosphoric acid, water, APST, and TMAS as follows:

| Component | Concentration (weight percent) |
|---|---|
| Phosphoric acid | 81.70 |
| Water | 14.05 |
| APST | 4.19 |
| TMAS | 0.06 |
| $HNO_3$ | 0.25 |

Composition A is as follows:

| Component | Concentration (weight percent) | |
|---|---|---|
| $H_2SO_4$ | 61.39 | 59-65 |
| Deionized water | 38.14 | 36-41 |
| $H_2SO_3$ | 0.2 | 0.01-0.3 |
| Formic Acid | 0.02 | 0.005-0.04 |
| $HNO_3$ | 0.25 | 0.1-0.4 |

This data shows that while several of the oxidizing formulations were effectively passivating annealed $n^+$ polysilicon, only composition A was effective in substantially reducing etching of annealed $n^+$ polysilicon.

Aspects

In a first aspect, the invention provides a composition comprising the reaction product of:

a. about 20 to about 80 weight percent of sulfuric acid;
b. about 20 to about 80 weight percent of water;
c. about 0.01 to about 0.4 weight percent of sulfurous acid;
d. about 0.1 to about 10 weight percent of nitric acid; and optionally
e. about 0.001 to about 0.1 weight percent of formic acid.

In a second aspect, the invention provides a composition which is the reaction product of;

a. about 59 to about 65 weight percent of sulfuric acid;
b. about 36 to about 41 weight percent of water;
c. about 0.01 to about 0.3 weight percent of sulfurous acid;
d. about 0.1 to about 0.04 weight percent of nitric acid; and optionally
e. about 0.005 to about 0.1 weight percent of formic acid.

In a third aspect, the invention provides the composition of the first aspect, wherein the nitric acid is utilized in an amount of about 0.1 to about 0.25 weight percent, based on the total weight of the composition.

In a fourth aspect, the invention provides a method of selectively etching silicon nitride on a microelectronic device substrate, the substrate comprising a surface comprising silicon nitride, a surface comprising silicon oxide, and a surface comprising polysilicon, the method comprising:

a. exposing the microelectronic device substrate comprising surfaces of silicon nitride, silicon oxide, and polysilicon, to a composition comprising nitrous acid;

followed by b. rinsing the substrate with a liquid solution comprising water; and
c. exposing the substrate to a composition effective in etching silicon nitride under conditions effective to etch silicon nitride.

In a fifth aspect, the invention provides a method of selectively etching silicon nitride on a microelectronic device substrate, the substrate comprising a surface comprising silicon nitride, a surface comprising silicon oxide, and a surface comprising polysilicon, the method comprising:

a. exposing the microelectronic device substrate comprising surfaces of silicon nitride, silicon oxide, and polysilicon, to a composition comprising the reaction product of:
   i. about 20 to about 80 weight percent of sulfuric acid;
   ii. about 20 to about 80 weight percent of water;
   iii. about 0.01 to about 0.4 weight percent of sulfurous acid;

iv. about 0.1 to about 10 weight percent of nitric acid; and optionally v. about 0.001 to about 0.1 weight percent of formic acid;

followed by b. rinsing the substrate with a liquid solution comprising water; and c. exposing the substrate to a composition effective in etching silicon nitride under conditions effective to etch silicon nitride.

In a sixth aspect, the invention provides the method of the fourth or fifth aspect, wherein the composition effective in etching silicon nitride is comprised of:

a. phosphoric acid; and b. a liquid comprising water.

In a seventh aspect, the invention provides the method of the sixth aspect, wherein the phosphoric acid is present in an amount of about 80 to about 90 weight percent, based on the total weight of the composition.

In an eighth aspect, the invention provides the method of the sixth aspect, wherein the composition effective in etching silicon nitride further comprises:

a composition comprising:

a. a compound of the formula

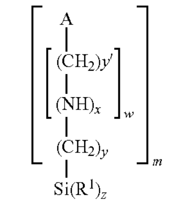

wherein A is an aromatic ring or a heteroaromatic ring, and wherein each $R^1$ is the same or different and is chosen from hydrogen, hydroxy or hydroxyl, $C_1$-$C_{20}$ alkyl, $C_1$-$C_{20}$ alkylamino, phenyl, benzyl, and $C_1$-$C_{20}$ alkoxy, phenoxy, and $C_3$-$C_8$ cycloalkyl; x is 0 or 1; each y and y' may be the same or different and is zero or is chosen from an integer of from 1 to 5; z is an integer chosen from 1, 2, or 3; m is an integer chosen from 1, 2, or 3; w is zero or an integer chosen from 1, 2, 3, or 4 and m+z=4; and/or b. a compound of the formula:

$(R^1)_3Si\text{-}M\text{-}Si(R^1)_3$, wherein each $R^1$ is the same or different and is as defined above, and -M- is chosen from —NH— or —O—.

In a ninth aspect, the invention provides the method of the sixth aspect, wherein the composition effective in etching silicon nitride further comprises:

a compound of the formula

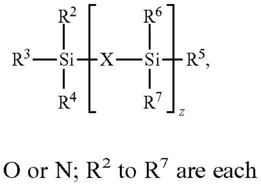

wherein X is O or N; $R^2$ to $R^7$ are each independently chosen from hydrogen, $C_1$-$C_{20}$ alkyl, $C_1$-$C_{20}$ alkoxy, $C_2$-$C_{20}$ alkenyl, $C_3$-$C_{20}$ cycloalkyl, $C_1$-$C_{20}$ aminoalkyl, $C_6$-$C_{20}$ aryl, $C_1$-$C_{20}$ alkylcarbonyl, $C_1$-$C_{20}$ alkylcarbonyloxy, $C_1$-$C_{10}$ cyanoalkyl; z is 0 or 1; and at least two of $R^2$ to $R^5$ are $C_1$-$C_{20}$ alkoxy groups when z is 0.

In a tenth aspect, the invention provides the method of the fourth or fifth aspect, wherein the composition effective in etching silicon nitride further comprises one or more compounds chosen from tetramethylammonium silicate;
N-(3-trimethoxysilylpropyl)diethylenetriamine;
N-(2-aminoethyl)-3-aminopropyltriethoxy silane;
N-(2-aminoethyl)-3-aminopropyl silane triol;
$N^1$-(3-trimethoxysilylpropyl)diethylenetriamine;
N-(6-aminohexyl)aminopropyltrimethoxysilane;
(3-aminopropyl)triethoxy-silane; and
(3-aminopropyl)silane triol, and phosphate esters thereof.

In an eleventh aspect, the invention provides the method of the fourth or fifth aspect, wherein the composition effective in etching silicon nitride comprises about 80 to about 90 weight percent phosphoric acid, water, tetramethylammonium silicate, and (3-aminopropyl)silanetriol, the total weight percent equaling 100 percent.

In a twelfth aspect, the invention provides the method of the eleventh aspect, wherein the composition effective in etching silicon nitride further comprises a fluoride compound.

In a thirteenth aspect, the invention provides a kit, including in two or more containers, two or more of i. the composition of claim 1, ii. phosphoric acid, iii. water; and iv. one or more compounds chosen from tetramethylammonium silicate;
N-(3-trimethoxysilylpropyl)diethylenetriamine;
N-(2-aminoethyl)-3-aminopropyltriethoxy silane;
N-(2-aminoethyl)-3-aminopropyl silane triol;
$N^1$-(3-trimethoxysilylpropyl)diethylenetriamine;
N-(6-aminohexyl)aminopropyltrimethoxysilane;
(3-aminopropyl)triethoxy-silane; and
(3-aminopropyl)silane triol, and phosphate esters thereof.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. The disclosure's scope is, of course, defined in the language in which the appended claims are expressed.

What is claimed is:

1. A composition comprising the reaction product of:

a. about 20 to about 80 weight percent of sulfuric acid;

b. about 20 to about 80 weight percent of water;

c. about 0.01 to about 0.4 weight percent of sulfurous acid;

d. about 0.1 to about 10 weight percent of nitric acid; and optionally e. about 0.001 to about 0.1 weight percent of formic acid, wherein the composition is substantially free of fluorides.

2. The composition of claim 1, which is the reaction product of;

a. about 59 to about 65 weight percent of sulfuric acid;

b. about 36 to about 41 weight percent of water;

c. about 0.01 to about 0.3 weight percent of sulfurous acid;

d. about 0.1 to about 0.4 weight percent of nitric acid; and optionally e. about 0.005 to about 0.1 weight percent of formic acid.

3. The composition of claim 1, wherein the nitric acid is utilized in an amount of about 0.1 to about 0.25 weight percent, based on the total weight of the composition.

4. A composition for passivating a surface consisting of the reaction product of:

a. about 20 to about 80 weight percent of sulfuric acid;

b. about 20 to about 80 weight percent of water;

c. about 0.01 to about 0.4 weight percent of sulfurous acid;

d. about 0.1 to about 10 weight percent of nitric acid; and optionally e. about 0.001 to about 0.1 weight percent of formic acid.

5. The composition of claim 4 including formic acid.

6. The composition of claim 4 without formic acid.

7. A method of selectively etching silicon nitride in the presence of silicon oxide and polysilicon comprising:

passivating a substrate comprising silicon nitride, silicon oxide, and polysilicon with a composition of claim 1; and selectively etching the silicon nitride with a second composition comprising:

phosphoric acid;

water; and at least one compound chosen from:

tetramethylammonium silicate (TMAS);

N-(3-trimethoxysilylpropyl)diethylenetriamine;

N-(2-aminoethyl)-3-aminopropyltriethoxy silane;

N-(2-aminoethyl)-3-aminopropyl silane triol;

$N^1$-(3-trimethoxysilylpropyl)diethylenetriamine;

N-(6-aminohexyl)aminopropyltrimethoxysilane;

(3-aminopropyl)triethoxy-silane;

(3-aminopropyl)silane triol (APST); and phosphate esters thereof.

8. The method of claim 7, further comprising removing a surface oxide from the substrate prior to passivating.

9. The method of claim 7, wherein the second composition comprises TMAS and APST.

* * * * *